United States Patent [19]
Roberts

[11] 3,996,570
[45] Dec. 7, 1976

[54] OPTICAL MASS MEMORY

[75] Inventor: Donald L. Roberts, San Diego, Calif.

[73] Assignee: NCR Corporation, Dayton, Ohio

[22] Filed: Aug. 1, 1975

[21] Appl. No.: 601,243

[52] U.S. Cl. .................. 340/173 LM; 235/61.11 E; 350/160 R

[51] Int. Cl.[2] .................. G11C 13/04; G06K 7/10; G02B 5/23

[58] Field of Search .............. 340/173 LT, 173 LS, 340/173 LM; 235/61.11 E; 350/289, 160 R, DIG. 1; 356/71

[56] References Cited
UNITED STATES PATENTS

| | | | |
|---|---|---|---|
| 3,096,441 | 7/1963 | Burkhardt | 340/173 LT |
| 3,191,157 | 6/1965 | Parker et al. | 340/173 LT |
| 3,706,080 | 12/1972 | Lee | 340/173 LM |
| 3,737,877 | 6/1973 | Feinleib | 340/173 LT |
| 3,765,749 | 10/1973 | LaMacchia | 340/173 LM |

*Primary Examiner*—Daryl W. Cook
*Attorney, Agent, or Firm*—J. T. Cavender; James H. Phillips; Edward A. Gerlaugh

[57] ABSTRACT

A data recording and retrieval system wherein a beam of coherent radiation is optically formed into an intense spot and deflected by first and second deflecting means to impinge upon a storage medium. The beam is spot-focused by a lens system which includes a multiple lens array, and selectively deflected by a pair of mirrors through a particular lenslet of the multiple-lens array to one of a plurality of storage fields of the recording medium. When the storage field is selected, a second deflection system produces a randomly selectable X-Y deflection of the beam, within the area of the preselected storage field. The multiple lens array provides a plurality of lenslets, each lenslet of the array corresponding with a different one of the plurality of storage fields within a storage area of the recording medium. Also included are means for illuminating a selected one of the areas of the storage medium and detector means for sensing data recorded on the selected storage field projected through a corresponding lenslet of the multiple lens array to the detector means.

15 Claims, 7 Drawing Figures

OPTICAL MASS MEMORY

BACKGROUND OF THE INVENTION

This invention relates generally to information storage and retrieval, and more particularly to high-density optical archival memories.

My copending applications Ser. No. 430,933 entitled HIGH DENSITY OPTICAL MEMORY STORAGE MEANS EMPLOYING A MULTIPLE LENS ARRAY, now U.S. Pat. No. 3,898,005; and Ser. No. 430,932 entitled MEANS EMPLOYING A MULTIPLE LENS ARRAY FOR READING FROM A HIGH DENSITY OPTICAL MEMORY STORAGE, now U.S. Pat. No. 3,899,778, disclose optical storage systems employing relatively low-energy light sources with high resolution photosensitive storage media.

Techniques for modifying a storage medium with a laser beam are well known in the art. The major advantages of this process for archival or write/read-only storage are low cost of the storage medium, virtually simultaneous access to the recorded data because no latent-image processing of the medium is required, and the reduced requirement for controlling environmental conditions which may affect the storage medium. Prior art archival stores utilizing laser recording employed recording lenses having a relatively low ratio of the focal length to aperture size, e.g. 0.33, for compatibility with the desired optical reduction and resolution of the recorded data. Such recording lenses limit the physical size of the recording field. Prior art systems characteristically employ physical movement of apparatus relatively close to the recording plane, viz., either movement of the medium itself in order to provide additional storage fields, or as in the aforementioned copending application Ser. No. 430,933, movement of an apertured plate in order to mask all but a selected one of plurality of recording lenses. Such physical movement of apparatus near the recording plane does not lend itself to random access systems.

SUMMARY OF THE INVENTION

It is therefore a principal object of my invention to provide an improved random-access optical mass storage system.

It is a more specific object of my invention to provide a random-access, optical archival memory utilizing laser recording.

Another object of my invention is to provide an optical archival storage system which reliably achieves extremely high storage density over a relatively large optical recording area without mechanical movement of apparatus near the recording plane.

These and other objects of the invention are achieved in accordance with a preferred embodiment thereof wherein a first deflection means alters the path of a modulated beam of coherent light to pass through a selected lenslet of a multiple lens array and impinge upon and alter a corresponding selected storage field of a storage medium. A second deflection means deflects the beam to selected storage locations within the storage field. Means are provided for illuminating and optically sensing the data stored in selected ones of the storage fields.

BRIEF DESCRIPTION OF THE DRAWINGS

The invention is pointed out with particularity in the appended claims; however, other features of the invention will become more apparent and the invention will be best understood by referring to the following detailed description in conjunction with the accompanying drawings, in the several figures of which like characters of reference identify like elements, and in which:

DESCRIPTION OF THE PREFERRED EMBODIMENT

Figure 1:
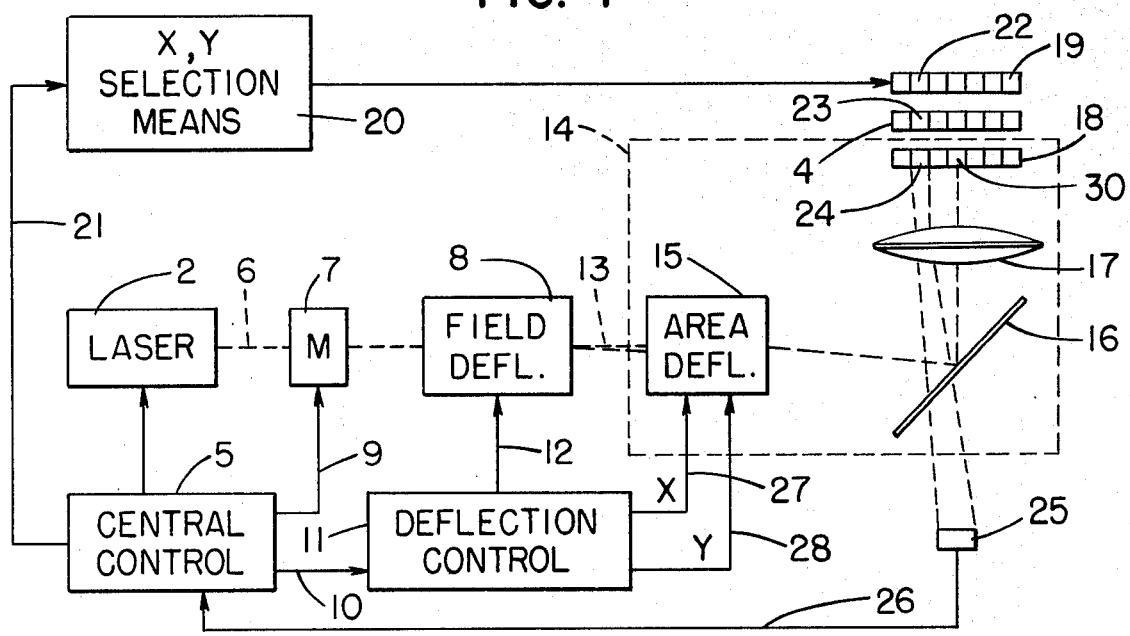
FIG. 1 is a diagram, partially in block form, of a system in accordance with the present invention.

Referring to FIG. 1 of the drawing, the primary elements of an archival storage system according to the present invention include a laser 2 for writing on a storage medium 4 under control of a central control 5 which may be, for example, a data processing system. A beam 6 of spatially-coherent light is generated by the laser 2 and directed through a modulator 7 to a two-dimensional deflector 8. The modulator 7, in response to signals on a line 9 from the central control 5, controls the pulse duration and amplitude of the beam to record data on the storage medium 4. The central control 5 also supplies control signals via a line 10 to a deflection control 11 which in turn supplies control signals via a line 12 to the deflector 8. The deflector 8 deflects the beam within a predefined field and passes the deflected beam 13 to a beam-transmission system 14. The beam-transmission system 14 includes an area deflection system 15 which directs the beam via a beam splitter 16 and a collimating lens 17 to a multiple lens array 18. The storage medium 4 is disposed intermediate the multiple lens array 18 and an illumination source 19 which may be a two-dimensional array of light-emitting diodes.

During a read operation an X, Y selection means 20 in response to control signals applied thereto via a line 21 from the central control 5 selects a predetermined storage field of the storage medium 4 for illumination and readout. Thus, assuming illumination of an exemplary area 22 of the array 19, light passes through a corresponding area 23 of the storage medium 4 and a corresponding lenslet 24 of the multiple lens array 18. An image of the storage field 23 is projected through the lenslet 24, the collimating lens 17 and the beam splitter 16 to a detector array 25. The information recorded on the storage field 23 is optically sensed by the array 25 and thus made available via a line 26 to information utilization apparatus such as the central control 5.

The area deflection system 15 in response to X and Y control signals applied, respectively, via lines 27 and 28 from the deflection control 11, directs the beam 13 to a selected one the lenslets such as lenslet 30 of the multiple lens array 18. The field deflector 8 selects a particular storage location or spot within the storage field corresponding with the lenslet 30 of FIG. 1 for recording a discrete data item. In this regard, it is noted that writing and reading may occur simultaneously in either the same or two different storage fields of the storage medium 4. A deflection control suitable for use with the present invention is described in U.S. Pat. No. 3,448,458 which is assigned to the same assignee as the present invention.

Figure 2:
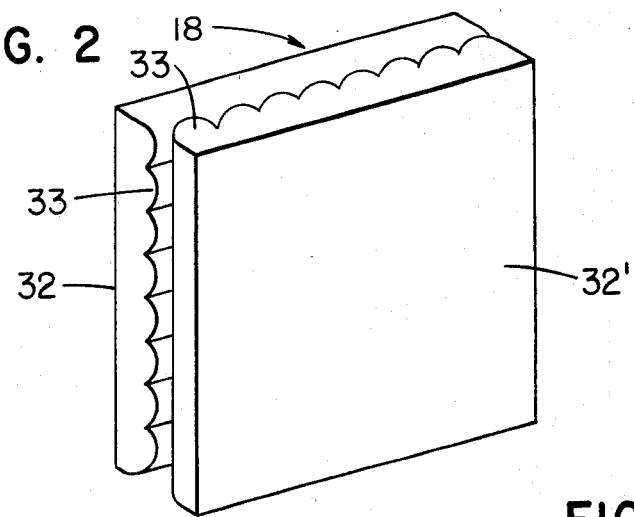
FIG. 2 is a diagram of a multiple lens array.

Attention is now directed to FIG. 2 which illustrates a multiple lens array 18. The multiple lens array 18 is a fundamental component of the system such that a brief description of its characteristics is deemed useful to a complete understanding of the invention. Briefly, the multiple lens array 18 comprises similar planar elements 32, 32' each formed from a plastic substrate and having parallel corrugations or cylindroidal elements 33 on one face thereof. The array elements 32, 32' are oriented with the faces carrying the corrugations 33 crossed at 90° in relation to one another, and brought together to form a square lenslet at each intersection of the corrugations. Twenty-five parallel corrugations per centimeter, a conservative density at the state-of-the-art, provides 625 lenslets per square centimeter. Each lenslet has a speed in the range of $f$-2.7 to $f$-3.2 with resolution capability of 400–500 lines per millimeter. Thus, for example, three micrometer diameter spot sizes may be worked with comfortably to achieve a discrete spot density on the order of $10^7$ per square centimeter.

The array elements 32, 32' are very uniform as a consequence of the fabrication technique employed. A metal negative master can be prepared with a linear or a Bonnet rotary ruling engine, and array elements are then cast from the master. At the state-of-the-art, the center-to-center accuracy of lenslets is better than 0.01 millimeters per 50 centimeters, and the focal-length tolerance is better than 1/10 of 1 percent. This uniform accuracy provides the basis for the recording precision necessary to enable read apparatus (which employs the same or an identical multiple lens array) to access the stored data.

Figure 3:
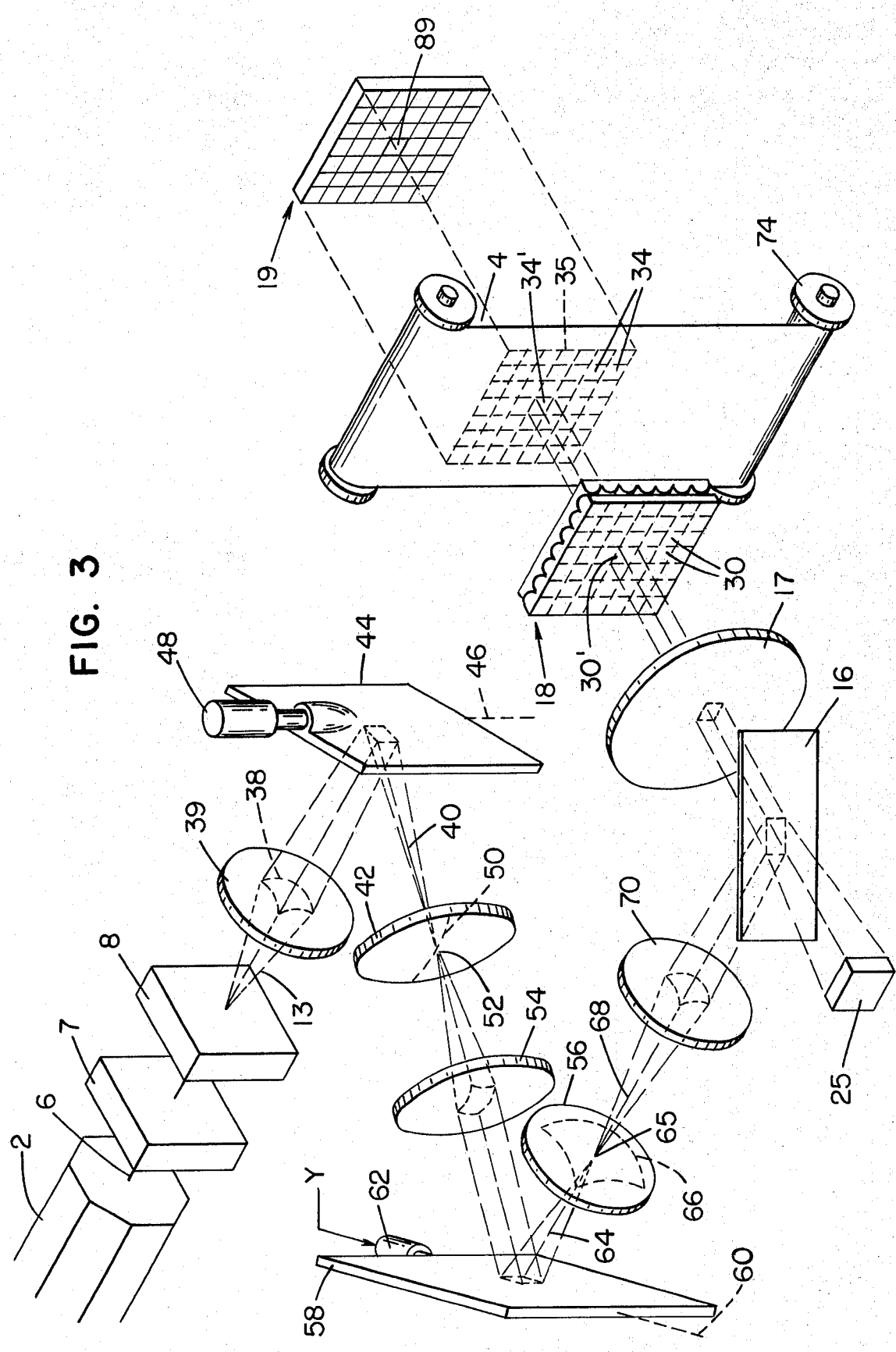
FIG. 3 is a pictorial, partially exploded diagram of a typical embodiment of the invention.

Referring now to FIG. 3, the optical elements of FIG. 1 are shown in more detail. The storage medium 4 is shown having a plurality of storage fields 34 including the centrally disposed storage field 34' within the bounds of a storage area 35. The multiple lens array 18 comprises a plurality of lenslets 30 including the centrally disposed lenslet 30'.

The laser 2 may be a conventional continuous-wave laser, oscillating in a single transverse mode. The beam 6 emitted by the laser has a divergence that is preferably diffraction limited so as to permit a Gaussian distribution of power through the cross-sectional area of the beam 6. A laser of this type which is commercially available is a Model 125 helium-neon gas laser manufactured by Spectra-Physics, Inc., of Mountain View, Cal. The model 125 laser has a power output of approximately 50–90 milliwatts, and generates a beam having a wavelength of 6328 angstroms and a divergence of approximately 0.7 milliradians. The modulator 7 may be of conventional form; for example, a Pockels cell, which rotates the plane of polarization of the beam in response to a signal applied thereto from the central control 5 (FIG. 1) in combination with an analyzer which converts the change in polarization to amplitude modulation. One such modulator is the Spectra-Physics Model 320 electro-optic modulator with a polarization analyzer. The modulated laser beam passes through the X, Y deflector 8 which may be, for example, a Zenith Model D-150R acousto-optic, 1000-spot deflector. The beam then passes through a relay lens 39 within the bounds of a deflection field 38 shown as a dashed outline centrally disposed on the relay lens 39. The plural lines of FIGS. 1 and 3 such as the divergent lines 13 emanating from the deflector 8 do not depict a beam having any substantial width, but illustrate only the peripheral bounds within which the highly concentrated beam of coherent light may be deflected.

The laser beam, after passing through the X, Y deflector 8, is said to be "field deflected" within the bounds of the field 38. The term field deflection is utilized herein to describe deflection imparted to the laser beam by the X, Y deflector 8, as distinguished from "area deflection" which is imparted to the beam in order to select a particular one of the plurality of storage fields 34 of the storage medium 4.

The area-deflection system 15 (FIG. 1) which directs the field-deflected beam to a selected one of the plurality of storage fields 34 is described hereinafter with reference to FIG. 3. A spot-forming or field lens 42 focuses the beam after the beam is reflected from a first mirror 44. The mirror 44 is rotatable about its vertically disposed axis 46, as by energizing an X servo-motor 48 in response to control signals applied thereto from the deflection control 11 (FIG. 1). The mirror 44 serves to position the beam 40 horizontally on the field lens 42 along a line indicated by reference number 50. A spot 52 is representative of the focal point of the beam 40 at the field lens 42. FIG. 3 shows the spot 52 centrally located on the field lens 42 indicating that the mirror 44 is centrally positioned and no area deflection is imparted to the beam 40 by the mirror 44. The beam 40 passes through a second relay lens 54 and is spot-focused at a second field lens 56 after being reflected from a second mirror 58 which functions as a vertical deflector. The vertical deflector 58 is rotatable about its horizontally disposed axis 60, as by energizing a Y servo-motor 62 in response to control signals applied thereto from the deflection control 11 (FIG. 1).

Devices other than the X and Y servo-motors 48, 62 shown in FIG. 3 may be utilized to rotate the deflectors 44, 58. For example, galvanometer units similar to those used in seismographic recorders may be used instead of the above mentioned servo-motors.

The axes 46, 60 of the respective mirrors 44, 58 are arranged at right angles with one another as viewed from the optical path so that the area deflection imparted to the light beam is represented in terms of X and Y coordinates, rotation of the mirror 44 imparting the X-coordinate deflection, and rotation of the deflector 58 imparting the Y-coordinate deflection. Upon respective discrete rotations of the two deflectors 44, 58, the area deflected beam 64 is focused as a spot within an area 66 of the field lens 56. A spot 65, shown centrally disposed in the area 66 of field lens 56, has no area deflection component, i.e., FIG. 3 illustrates the mirrors 44, 58 centrally positioned to direct the beam to the central storage area 34'. After passing through a third relay lens 70, the beam 68 is reflected from the beam splitter 16 through the collimating lens 17 and the centrally disposed lenslet 30' of the multiple lens array 18 to impinge on the corresponding storage field 34' of the storage medium 4. The field-deflected beam 13 thus addresses the storage field 34' for recording information thereon.

Figure 4:
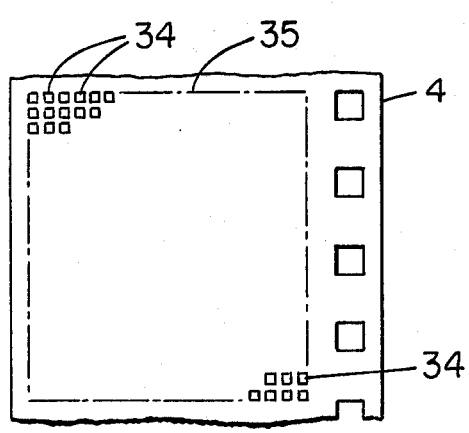
FIG. 4 illustrates a typical storage medium having a plurality of storage fields thereon.
Figure 5:
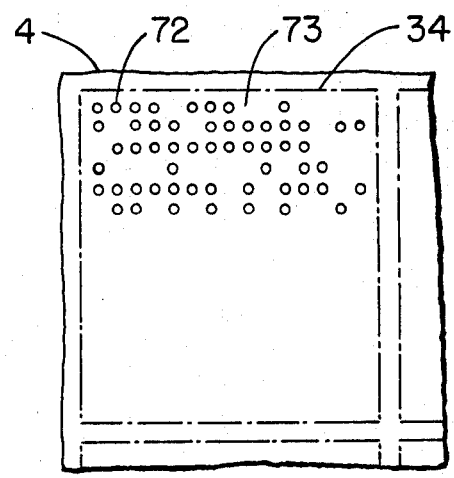
FIG. 5 is an enlarged fragmentary view of FIG. 4 illustrating a typical storage field having digital data recorded thereon.

The high storage density of a system in accordance with the invention can be appreciated by reference to FIGS. 4 and 5 which illustrate an exemplary recording medium 4 having a storage area 35 typically 3 centimeters on a side. Within the bounds of the area 35 are 9216 (96 × 96) storage fields 34, each typically 0.3125 millimeters square, and each field 34 capable of being accessed either by raster scanning or randomly by a 2–3 micrometer spot as typically illustrated for the storage field 34 in FIG. 5. Serial or scanned access may be achieved by utilizing a field deflection system 8 (FIG. 1) generating a field scan pattern, as for example, by a rotating and oscillating mirrored polygon system described in commonly assigned U.S. Pat. Nos. 3,701,999; 3,529,884; and 3,465,352. The preferred system of the present invention utilizes random field deflection.

Referring still to FIGS. 4 and 5, each storage field 34 may typically store 1,280 bits of data; for example, the presence of a recorded spot at a bit storage location 72 in FIG. 5 may indicate one binary digit, and the absence of a recorded spot at another storage location such as illustrated by reference number 73 in FIG. 5 may indicate the other binary digit. Each storage field 34 of the exemplary embodiment contains 32 words of 40 bits per word for a storage capacity of 1,280 bits per field. A preferred system having a storage density less conservative than the exemplary embodiment stores 4096 bits in a 64 × 64 bit field of the same size as described for the exemplary embodiment, a bit density well within the resolution capability of the components described. At the more conservative storage density of the exemplary embodiment (see FIG. 4), a storage area 35 having 9,216 fields 34 is capable of storing in excess of $10^7$ bits of information without repositioning the storage medium 4 to another storage area such as the area 35. This represents a storage density of $1.31 \times 10^6$ bits per square centimeter. The exemplary system is capable of access time (latency plus transfer time) within a storage area having $10^7$ bits of less than 5 milliseconds for write, and about 100 nanoseconds for read operations. With the storage medium 4 in strip or reel form, $10^7$ bit blocks of data can be selected typically in less than one second. A strip of the storage medium 4, 35 millimeters wide and 26 meters long can store over $10^{10}$ bits of information, any portion thereof accessable in less than 5 seconds.

The storage medium 4 is shown typically in FIG. 3 to be a moveable tape or strip which may be for example a heat sensitive material on a flexible plastic substrate. The preferred embodiment of my invention utilizes a recording medium as disclosed in U.S. Pat. No. 3,787,210 entitled LASER RECORDING TECHNIQUE USING COMBUSTIBLE BLOW-OFF, issued to the undersigned and assigned to the same assignee as the present invention. A mechanical driving arrangement 74 for the storage medium may be similar to those utilized in magnetic tape or photographic film drives.

Considering the recording medium 4, it is understood that because the present invention makes it possible to convert substantially the entire output of a laser into a reduced, controllably positionable spot of 2–3 micrometers or less, the spot contains sufficient laser energy to effect a wide variety of changes in materials appropriately chosen for the recording medium 4. Not only can photosensitive materials such as silver halide and other low-energy responsive materials be used for the recording medium 4, but also, relatively high-energy responsive materials (e.g. photochromic materials) can be used. Silver halide media require the development of a latent image, and thus are not suitable for applications involving simultaneous writing and reading operations, as for example, in the preferred embodiment of an archival storage system. In the preferred embodiment of the invention the recording medium comprises a low-energy responsive material utilizing a transparent substrate coated with heat absorbing particles dispersed in a self-oxidizing binder. This medium is capable of the desired resolution and therefore permits unusually high recording speeds. Utilizing the Gaussian distribution of the energy in the laser beam to record with the "tip" of the beam, spot sizes of less than one micrometer have been achieved with regularity.

Figure 6:
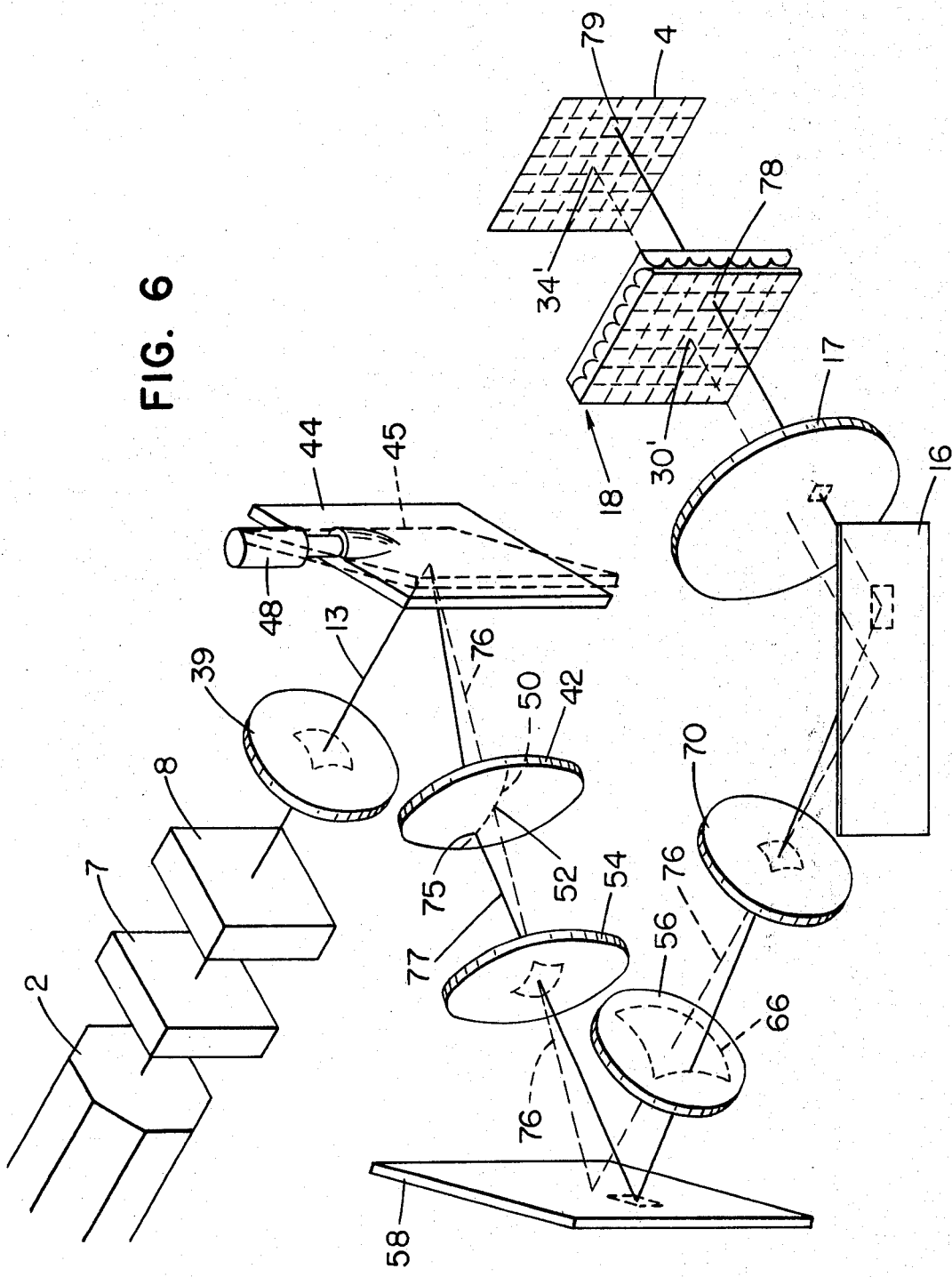
FIGS. 6 and 7 are pictorial views of the invention illustrating the storage field selection means.
Figure 7:
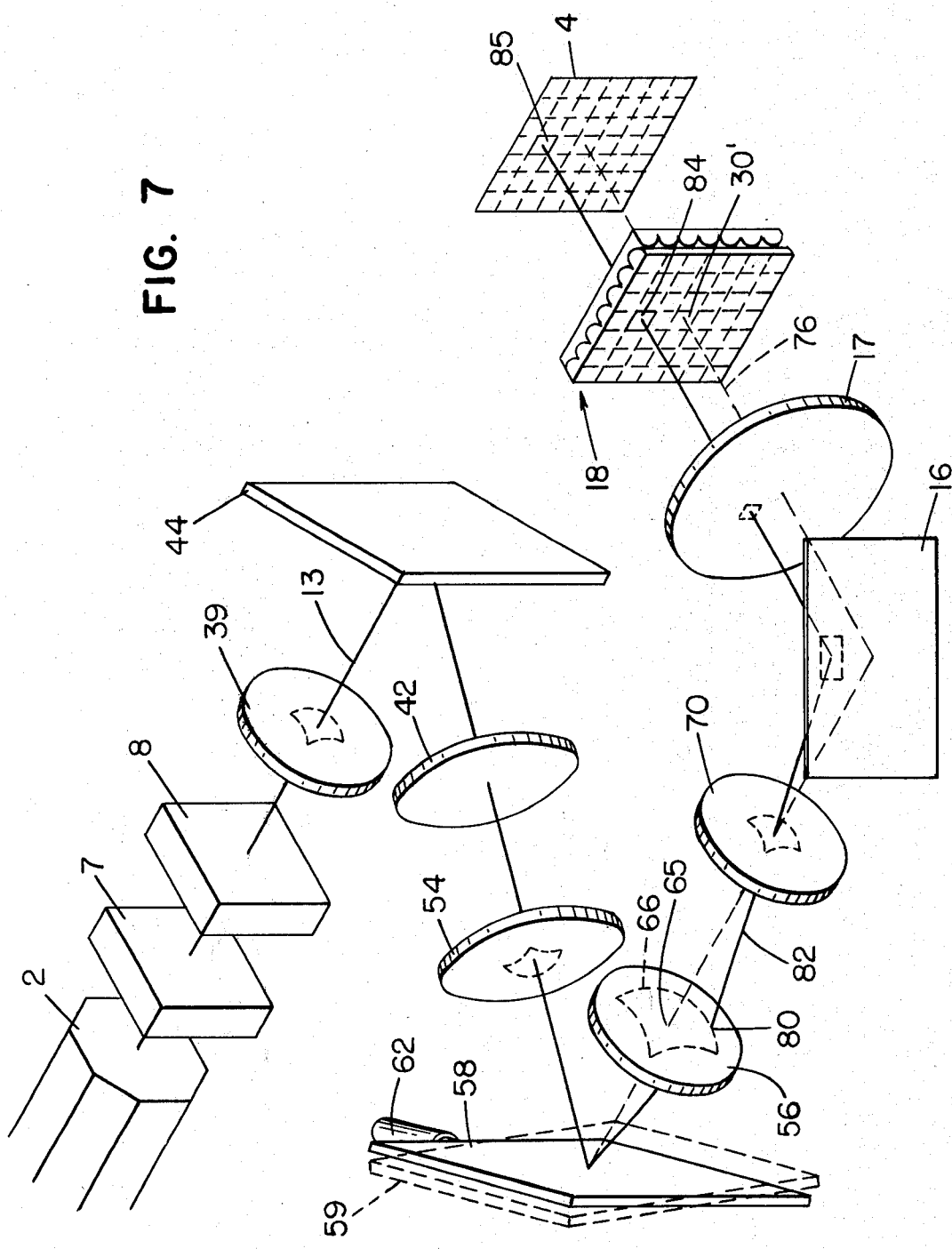

Referring now to FIGS. 6 and 7, the deflection system imparting area deflection to the field-deflected laser beam 13 is shown in greater detail. FIG. 6 illustrates X-coordinate deflection of the beam 13 wherein the first mirror 44 is rotated slightly clockwise from its central position (indicated for reference by dashed lines 45) to position the beam at a spot 75 along the line 50 of the field lens 42. The spot 75 is deflected away from the center 52 of the lens 42 in an X-coordinate direction (laterally). The path of a centrally disposed beam is shown for reference purposes by dashed lines bearing reference number 76 in FIG. 6. A centrally disposed beam, i.e., a beam having no area deflection, impinges on the centrally disposed storage field 34' as previously described with reference to FIG. 3. The deflected beam 77 is then passed through the relay lens 54; reflected from the second mirror 58 (which remains centrally positioned) through the field lens 56 and the relay lens 70; and reflected from the beam splitter 16 through the collimating lens 17 to a selected lenslet 78 of the multiple lens array 18. The selected lenslet 78 is displaced from the centrally disposed lenslet 34' in an X-coordinate direction and is selected in response to a predetermined discrete rotation of the mirror 44. A storage field 79 corresponding with the selected lenslet 78 is thus selected for a write operation by deflecting the laser beam for impingement thereon. Individual storage locations within the storage field 79 are selected as previously described with reference to FIG. 5.

FIG. 7 illustrates Y-coordinate deflection of the laser beam 13 wherein the second mirror 58 is rotated slightly clockwise from its central position (indicated for reference by dashed lines 59) to position the beam at a spot 80 within the deflection area 66 of field lens 56. The spot 80 is deflected away from the center 65 of lens 56 in a Y-coordinate direction (vertically). The path of a centrally disposed beam is shown for reference purposes by dashed lines bearing reference number 76 in FIG. 7. The deflected beam 82 is then passed through the relay lens 70, reflected from the beam splitter 16 through the collimating lens 17 to a selected lenslet 84 of the multiple lens array 18. The selected lenslet 84 is displaced from the centrally disposed lenslet 30' in a Y-coordinate direction and is selected in response to a predetermined discrete rotation of the mirror 58. A storage field 85 corresponding with the selected lenslet 84 is thus selected for a write operation by deflecting the laser beam for impingement thereon. Individual storage locations within the storage field 85 are selected as previously described with reference to FIG. 5.

Referring now to FIGS. 1 and 3 the illumination source 19 comprises a plurality of elements such as the element 22, each individually selectable for illumination under control of the X, Y selection means 20. The illumination elements which may be, for example, light-emitting diodes, are arranged in a two-dimensional matrix, each element corresponding with at least one of the storage fields of the storage medium 4. The multiple lens array 18 is positioned intermediate the storage medium 4 and the detector array 25. Light issued from the selected element 22 of the illumination array 19 passes through the information bearing field 23 of the storage medium 4. The information bearing beam then passes through the lenslet 24 of the multiple lens array 18, the collimating lens 17 and the beam splitter 16. The information bearing beam is expanded by the lens system 24, 17 to impinge upon the active area of the detector array 25. Thus, one field or "page" of information stored in the information bearing field 23 of the storage medium 4 may be accessed by the detector array 25 as a consequence of energizing the selected element 22 of the illumination array 19. Any other selected page of information carried by the storage medium 4 within the area 35 may similarly be projected onto and sensed by the detector array 25 by energizing the corresponding illumination element; for example, the centrally disposed storage field 34' (FIG. 3) may be accessed for reading the information stored therein by energizing the central illumination element 89.

A diode detector array suitable for use with the preferred embodiment of the invention is disclosed in U.S. Pat. No. 3,855,582, entitled PARALLEL BIASED PHOTODETECTOR MATRIX which issued to the undersigned on Dec. 17, 1974 and is assigned to the same assignee as the present invention.

It may be noted in FIG. 1, as well as the other figures, that the arrays and matrices are depicted as 7 × 7 grids. It is understood that, as a practical matter, the grid density is typically on the order of 25 × 25 or 32 × 32 per square centimeter as previously described.

It is further noted that the multiple lens array 18 and the storage medium 4 are juxtaposed quite closely to one another. More specifically, the storage medium 4 is positioned in the focal plane of the multiple lens array 18. The collimating lens 17 is employed to direct the light from a selected lenslet to the detector array 25 such that the light passes symmetrically about the optic axis of the lenslet and consequently, upon being refracted by lens 17, is directed to the detector array 25 through the beam splitter 16. The distance between the lens 17 and the sense face of the detector array 25 should therefore be equal to the focal length of lens 17. In practice, this distance is preferably made adjustable to permit accommodation of uniform dimensional changes of the storage medium 4 resulting from temperature variations, water absorption, imperfect duplication, etc. Otherwise, a change in dimension of the storage medium could result in a shifting of some of the projected storage field images at the detector means 25 whereby the bits of the projected image would not register with the corresponding cells of the detector array 25. The magnification of the read system is determined by the distance between the lens 17 and the face of the detector array 25 divided by the focal length of the lenslets of the multiple lens array 18. This magnification, and therefore the distance between lens 17 and the detector means 25, must remain substantially constant; however, so long as the detector array remains within the depth of focus of the projected image, the focal length of lens 17 can be varied by a zoom process. Thus, correction to accommodate specific storage media can be performed after the media have been inserted into the system by, for example, altering the focal length of lens 17 in accordance with alignment information provided in predetermined storage fields of the storage medium 4. It appears that subsequent realignment need only be carried out if extreme environmental changes are encountered.

It will be apparent to those skilled in the art that the disclosed optical mass memory may be modified in numerous ways and may assume many embodiments other than the preferred form specifically set out and described above. For example, the illumination means and the detector means utilized for read operations may be implemented, respectively, with a cathode ray tube and a TV camera tube. Further, the preferred embodiment describes a storage area having a capacity of $10^7$ bits. It is obvious that by increasing the size, i.e., the number of lenslets of the multiple lens array, the memory storage capacity (exclusive of media movement) may be significantly increased. The capacity of the storage area 35 should not be taken as a limiting factor of the invention. Accordingly, the appended claims are intended to cover all modifications of my invention which fall within the limits only of the true spirit and scope of the invention.

What is claimed is:
1. An information storage system, comprising:
a source of collimated, coherent radiation;
a storage medium having a plurality of storage fields;
means for modulating said radiation in accordance with information to be stored on said storage medium; and
optical means for directing said radiation to said storage medium, said optical means characterized by
an optical array having at least two unitary elements forming a multiplicity of lenslets, each of said lenslets corresponding with a different one of said plurality of storage fields, said storage fields each disposed in the focal plane of the corresponding lenslet, said optical means further including
first means for directing said radiation to a selected one of said storage fields through said lenslet corresponding with said selected storage field, and
second means for deflecting the radiation to coordinately select discrete storage locations within said selected storage field.
2. The information storage system of claim 1, wherein each of the at least two unitary elements of said optical array comprises a substrate having parallel cylindroidal corrugations on one face thereof, said faces brought together with said corrugations mutually perpendicular to form at each intersection thereof one of said multiplicity of lenslets.
3. The information storage system of claim 1, wherein each of the multiplicity of lenslets is of square configuration comprising a pair of opposed cylindroidal elements crossed at 90° with one another.
4. The information storage system of clam 3 wherein each one of said pair of cylindroidal elements lies in a respective one of said elements of said optical array.
5. The information storage system of claim 1, wherein said directing means comprises:
first reflecting means for providing lateral displacement of said radiation with respect to the optical path thereof; and
second reflecting means for providing displacement of said radiation generally transverse said lateral displacement, said first and second reflecting means being cooperative to direct said radiation to a selected lenslet of said optical array.

6. The information storage system of claim 1, wherein said directing means further comprises a collimating lens intermediate said directing means and said optical array.

7. The information storage system of claim 6, further comprising:
    means for illuminating another selected one of said plurality of storage fields to form an image of information stored at said discrete storage locations thereof;
    photosensitive detector means arranged to intercept said image transmitted through the lenslet corresponding with said other selected storage field and said collimating lens for detecting said stored information; and
    means coupled to said detector means for utilizing said stored information.

8. The information storage system of claim 6, further comprising:
    a beam splitter intermediate said directing means and said collimating lens;
    means for illuminating said selected one of said storage fields to form an image of information stored at said discrete storage locations thereof;
    means arranged to intercept said image transmitted through said corresponding lenslet, said collimating lens and said beam splitter for detecting said stored information; and
    means coupled to said detecting means for utilizing said stored information.

9. An information storage system, comprising:
    a source of collimated radiation;
    a storage medium having a plurality of storage fields, each of said fields having an array of discrete storage locations, said medium sensitive to said radiation to record a transparent indication of impingement of said radiation at said discrete locations;
    means for modulating said radiation in accordance with information to be stored on said storage medium;
    optical means for directing said radiation to a selected one of said storage fields, said optical means including
        an optical array having at least two unitary planar elements forming a multiplicity of lenslets, each lenslet corresponding with a different one of said plurality of storage fields, said storage fields each disposed in the focal plane of said optical array;
        means for directing said radiation to one of said multiplicity of lenslets corresponding with said selected storage field; and
    means intermediate said source and said optical means for selectively deflecting the radiation within the bounds of a storage field.

10. The information storage system of claim 9, further comprising:
    an illumination array adjacent said storage medium;
    means for selectively energizing said illumination array to illuminate a predetermined one of said storage fields;
    means having an array of discrete detectors proportional in size to said array of discrete storage locations for detecting illumination from said illumination array transmitted through said transparent indications of stored information of said predetermined storage field.

11. The information storage system of claim 10, wherein the illumination array comprises a plurality of light-emitting diodes, each of said diodes corresponding with a different one of said plurality of storage fields.

12. An optical memory system, comprising in combination:
    a source of data to be stored;
    means for emitting a collimated beam of coherent optical radiation;
    means coupled to said source for modulating said beam in accordance with said data to be stored;
    means for developing first and second deflection signals;
    means responsive to said first deflection signals for deflecting said beam within a predetermined field of divergence;
    a storage medium having a plurality of image fields and formed of a material sensitive to impingement of said beam thereon to record at discrete locations of said storage medium indicia of said impingement;
    an optical system for directing said deflected beam to said storage medium and including
        an optical array having at least two unitary planar optical elements together forming a multiplicity of lenslets, each of said lenslets corresponding with a different one of said image fields, said storage medium disposed in the focal plane of said optical array;
        a lens system for focusing said deflected beam within a field at an entrance pupil of each of said multiplicity of lenslets; and
        means in cooperation with said lens system and responsive to said second deflection signals for directing said deflected beam to a selected one of said multiplicity of lenslets, said selected lenslet focusing said beam on said corresonding image field of said storage medium.

13. The optical memory system of claim 12, wherein said lens system includes a collimating lens intermediate said directing means and said multiple lens array.

14. The optical memory system of claim 12, wherein said directing means comprises:
    first reflecting means for providing lateral displacement of said deflected beam with respect to the optical path thereof; and
    second reflecting means for providing displacement of said deflected beam generally transverse said lateral displacement.

15. The optical memory system of claim 13, further comprising:
    means adjacent said storage medium for illuminating said storage medium;
    means for energizing said illuminating means to illuminate a predetermined one of said image fields;
    means for detecting light transmitted from said illuminating means through said predetermined image field whereby indicia of data stored at said discrete location is sensed; and
    means coupled to said detecting means for utilizing said sensed data.

* * * * *